United States Patent
Wang et al.

(10) Patent No.: US 7,025,124 B2
(45) Date of Patent: Apr. 11, 2006

(54) SUPPORTING STRUCTURE FOR PLANAR HEAT PIPE

(76) Inventors: Chin Wen Wang, 4f-3., No. 9, Sinfu 1st St., Pingjhen City, Taoyuan County 324 (TW); Pei Choa Wang, 14F-3., No. 9 Sinfu 1st St., Pingjhen City, Taoyuan County 324 (TW); Ching Chung Wang, 14F., No. 9, Sinfu 1st St., Pingjhen City, Taoyuan County 324 (TW)

(*) Notice: Subject to any disclaimer, the term of this patent is extended or adjusted under 35 U.S.C. 154(b) by 0 days.

(21) Appl. No.: 10/691,510

(22) Filed: Oct. 24, 2003

(65) Prior Publication Data

US 2005/0087327 A1   Apr. 28, 2005

(51) Int. Cl.
    *F28D 15/04* (2006.01)

(52) U.S. Cl. ............................. 165/104.21; 165/104.26; 165/104.33

(58) Field of Classification Search ............ 165/104.21, 165/104.19, 104.33, 104.26; 257/715; 361/700; 174/15.2
See application file for complete search history.

(56) References Cited

U.S. PATENT DOCUMENTS

| | | | | |
|---|---|---|---|---|
| 3,613,778 A * | 10/1971 | Feldman, Jr. | .......... | 165/104.26 |
| 5,427,174 A * | 6/1995 | Lomolino et al. | ..... | 165/104.26 |
| 5,761,037 A * | 6/1998 | Anderson et al. | ...... | 165/104.26 |
| 6,164,368 A * | 12/2000 | Furukawa et al. | ..... | 165/104.33 |
| 6,167,948 B1 * | 1/2001 | Thomas | ................. | 165/104.26 |
| 6,382,309 B1 * | 5/2002 | Kroliczek et al. | ..... | 165/104.26 |
| 6,695,040 B1 * | 2/2004 | Kung et al. | ............ | 165/104.26 |
| 6,749,013 B1 * | 6/2004 | Ikeda et al. | ............ | 165/104.26 |
| 2002/0023742 A1 * | 2/2002 | Dussinger et al. | ..... | 165/104.26 |
| 2002/0056542 A1 * | 5/2002 | Yamamoto et al. | .... | 165/104.26 |
| 2002/0135980 A1 * | 9/2002 | Vafai | ..................... | 165/104.33 |
| 2003/0136550 A1 * | 7/2003 | Tung et al. | ............ | 165/104.26 |
| 2004/0016534 A1 * | 1/2004 | Lai | ...................... | 165/104.26 |
| 2004/0069455 A1 * | 4/2004 | Lindemuth et al. | .... | 165/104.15 |

FOREIGN PATENT DOCUMENTS

JP    2001-165584    *    6/2001

\* cited by examiner

*Primary Examiner*—Teresa J. Walberg

(57) ABSTRACT

An improved supporting structure for a planar heat pipe, having a housing and a supporting member installed in the shell is disclosed. The housing has an upper lid and a lower lid engaged with each other to form a hollow chamber therein. The hollow chamber is filled with a working fluid. The supporting member is a planar member perforated with a plurality of holes. The supporting member is sintered with the upper and lower lids in the hollow chamber. Therefore, the housing and the supporting member are integrated together.

2 Claims, 4 Drawing Sheets

SUPPORTING STRUCTURE FOR PLANAR HEAT PIPE

BACKGROUND OF THE INVENTION

The present invention relates to an improved supporting structure of a planar heat pipe. The supporting structure provides improved integration strength and temperature uniformity of the heat pipe, such that the more heat can be transferred thereby.

The advancement of computer industry has developed a lot of high-precision electronic devices. Accompanying with the improved functions and operation speeds, these electronic devices generate more and more heat. To allow the electronic devices working under normal operational temperatures, how to efficiently dissipate the heat generated by these electronic devices has become an important topic for the research people in such industry.

FIG. 1 shows a conventional planar heat pipe 1a. The planar heat pipe 1a is mainly mounted on a central processing unit (CPU) 3a. The planar heat pipe 1a includes an upper lid 11a and a lower lid 12a to construct a housing 10a and a hollow chamber 13a enclosed by the housing 10a. Wick structure 14a can be formed on the interior surface of the hollow chamber 13a, and an adequate amount of work fluid is introduced into the hollow chamber 13a. To prevent indention of the upper and lower lids 11a and 12a by vacuuming the heat pipe 1a, a support member 15a is installed in the housing 10a for increasing strength of the heat pipe 1a.

However, the hollow chamber 13a of the heat pipe 1a must allow the work fluid to circulate therein. The support member 15a is not fully in contact with the upper and lower lids 11a and 12a. Therefore, the vacuum process performed on the heat pipe 1a will still cause indention or recess of the upper and lower lids 11a and 12a. Therefore, while integrating the heat pipe 1a with a heat sink 2a, a surface contact cannot be obtained between the heat sink 2a and the heat pipe 1a as shown in FIG. 2. Therefore, a thermal resistance is resulted, and the heat dissipation effect is seriously degraded.

BRIEF SUMMARY OF THE INVENTION

The present invention provides an improved supporting structure for a planar heat pipe. The improved supporting structure improves the joint strength between the upper and lower lids of the heat pipe. The planarity of the housing is maintained by the improved supporting structure during vacuum process. Further, the thermal expansion caused by vapor pressure during phase transition of the heat pipe is prevented, such that the heat pipe can withstand strain and stress.

The improved supporting structure provided by the present invention comprises a housing and a support member within the housing. The housing is a hollow enclosure that includes an upper lid and a lower lid. The upper and lower lids are engaged with each to form a close hollow chamber, and a working fluid is introduced into the hollow chamber. The support member includes a planar member perforated with a plurality of holes. The support member is sintered with the upper and lower lids by power metallurgy, such that the integration between the support member and the housing is enhanced, and the joint strength between the support member and the upper and lower lids is improved.

BRIEF DESCRIPTION OF THE DRAWINGS

These, as well as other features of the present invention, will become apparent upon reference to the drawings wherein.

DETAILED DESCRIPTION OF THE INVENTION

Figure 1:
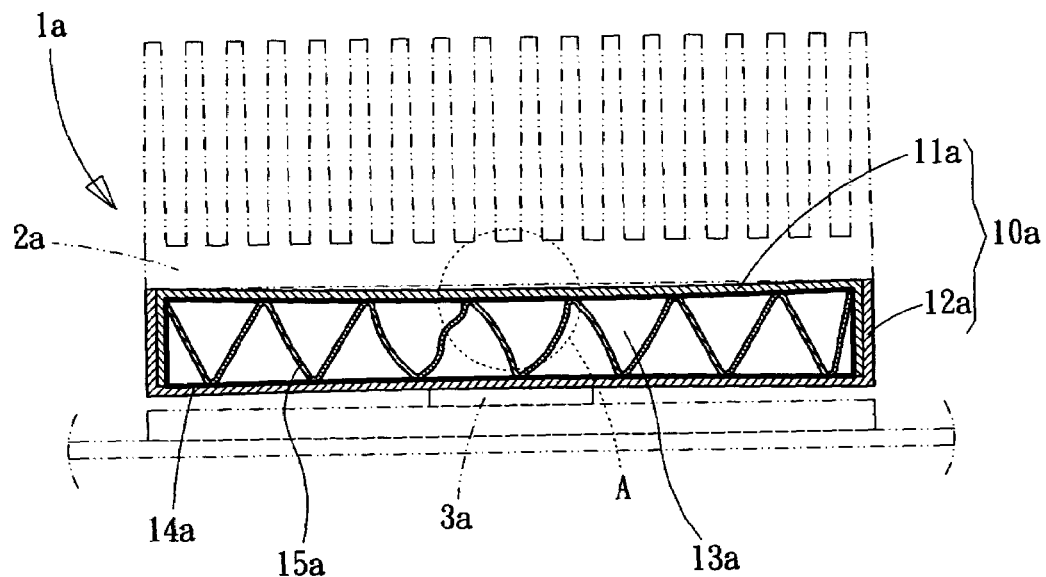
FIG. 1 shows a conventional planar heat pipe.
Figure 2:
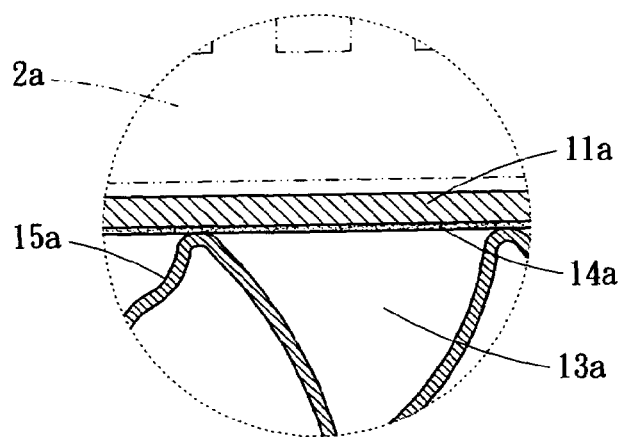
FIG. 2 shows a local enlarged view of FIG. 1.
Figure 3:
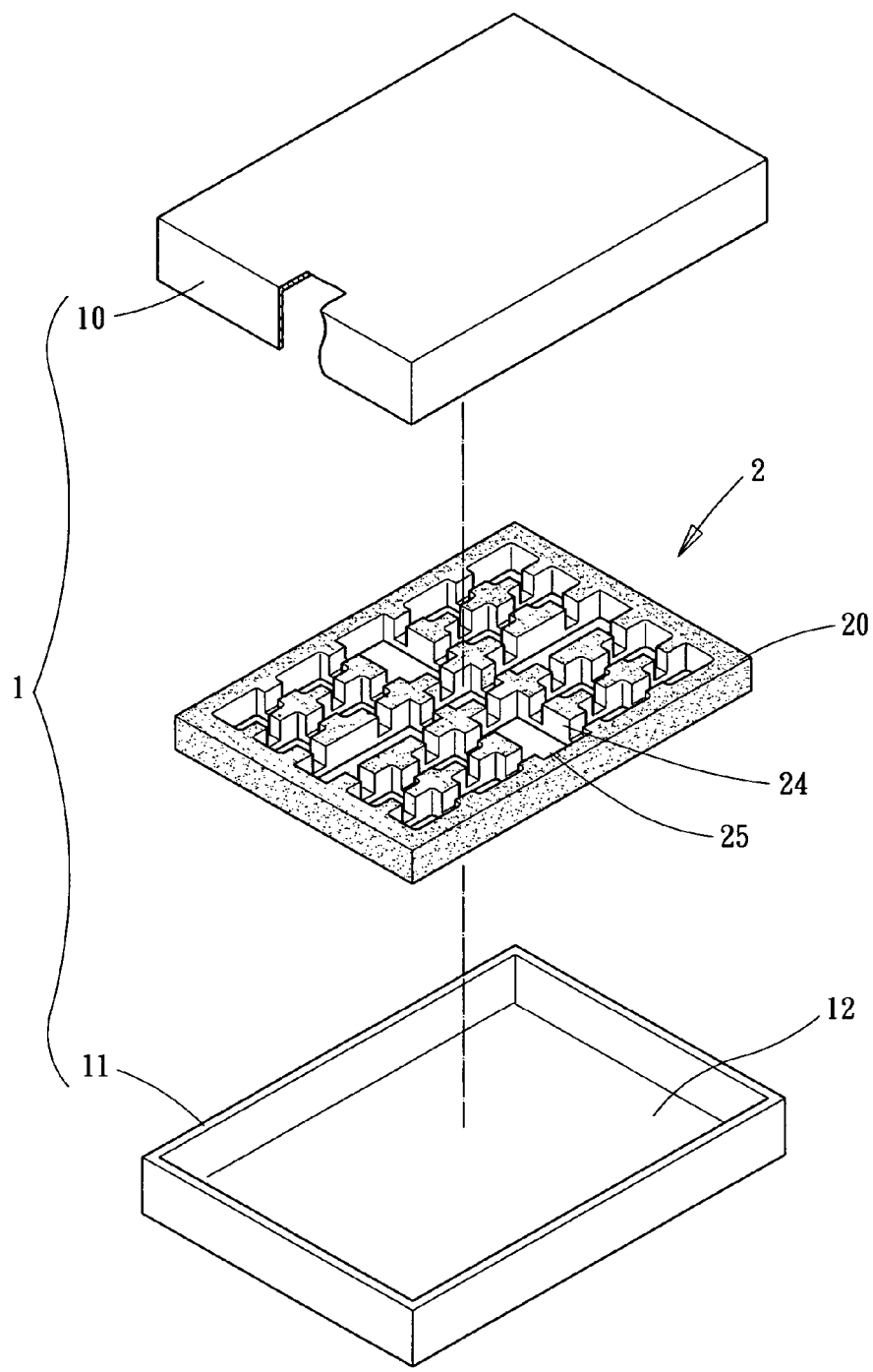
FIG. 3 shows an exploded view of a heat pipe provided by the present invention.
Figure 4:
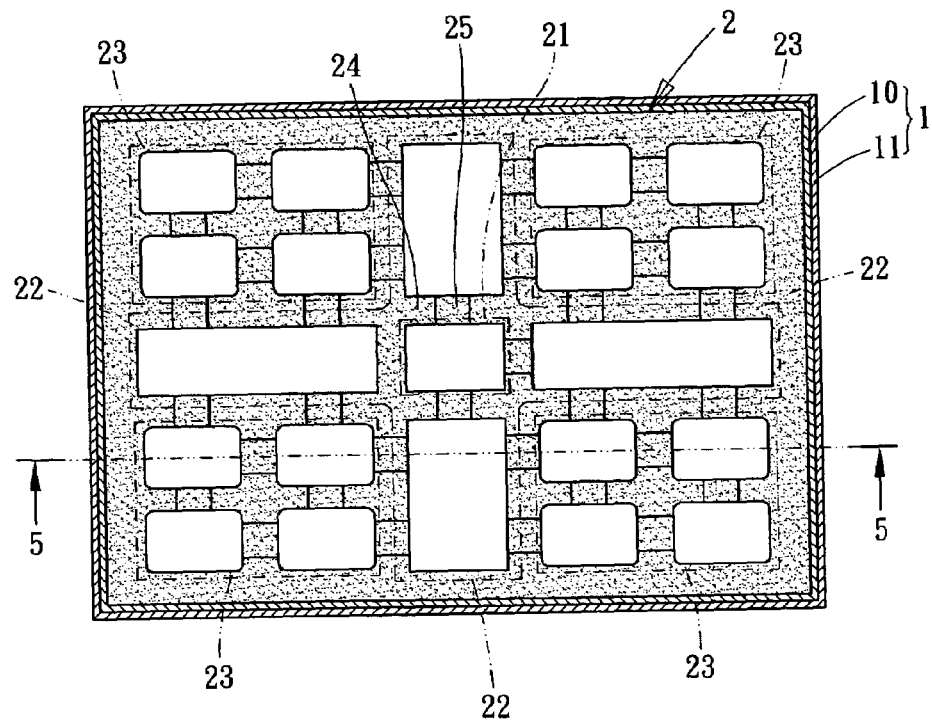
FIG. 4 shows a top view of the heat pipe as shown in FIG. 3.
Figure 5:
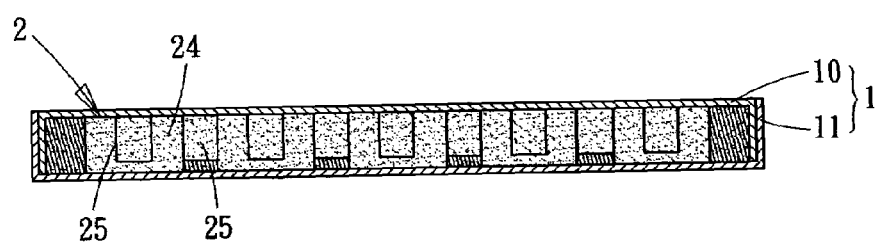
FIG. 5 shows a cross sectional view along line 5—5 as shown in FIG. 4.

FIG. 3 shows an exploded view of a heat pipe provided by the present invention, and FIGS. 4 and 5 depict the top view and cross sectional view of the heat pipe, respectively. As shown, a planar heat pipe is provided, and the planar heat pipe includes a housing 1 and a support member 2 within the housing 2.

The housing 1 is preferably a hollow enclosure with an upper lid 11 and a lower lid 12. The upper and lower lids 11 and 12 are preferably fabricated from good conductive materials such as copper. The upper and lower lids 11 and 12 are engaged with each other to form a close hollow chamber 12, in which an adequate amount of work fluid can be injected.

The support member 2 includes a planar member perforated with a plurality of holes. The support member 2 is preferably sintered with the upper and lower lids 11 and 12 by power metallurgy, such that the support member 2 and the upper and lower lids 11 and 12 are integrated. To improve joint strength between the support member 2 and the upper and lower lids 11 and 12, as shown in FIG. 4, the support member 2 is perforated with a first perforation region 21, a plurality of second perforation regions 22 and a plurality of third perforation regions 23. The first perforation region 21 is located at the center of the support member 2, the second perforation regions 22 are distributed around the first perforation region 21, and the third perforation regions 23 are distributed between the second perforation regions 22 and a periphery of the planar member 2. In this embodiment as shown in FIG. 4, the central first perforation region 21 includes a rectangular shape with four perpendicular sides. Each of the second perforation regions 22 is also configured with rectangular shape and extends from the respective side of the first perforation region 21. Therefore, the first and second perforation regions 21 and 22 form a central cross which define four peripheral regions in which the third perforation regions 3 are distributed. The communication between the first, second and third perforation regions 21, 22 and 23 are blocked from each other by ribs 24 protruding from the planar member 2 therebetween. However, channels 25 may be formed across the ribs 24 to establish fluid communications between the first, second and third perforation regions 21, 22 and 23.

Thereby, an improved supporting structure for a planar heat pipe is constructed.

Figure 6:
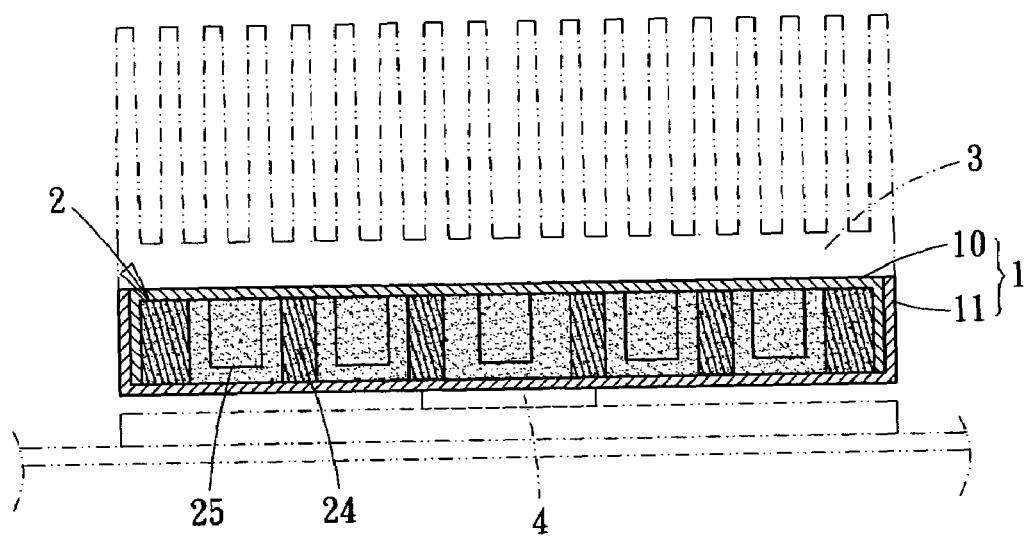
FIG. 6 shows the operation status of the heat pipe.

As shown in FIG. 6, as the support member 2 is fabricated by power metallurgy sintering, such that porosity exists in the support member 2. The work fluid in phase transition can thus flows between the perforation regions of the housing 1. Further, as the support member 2 is sintered with the upper and lower lids 10 and 11, the strength of the housing 1 is enhanced by the formation of the support member 2. Therefore, planarity of the planar housing 1 is maintained during vacuum process of the heat pipe. Therefore, while placing the heat pipe in contact with external heat sink 3 or central processing unit 4, a surface contact can be obtained. By a small amount of heat dissipating paste, a good heat dissipation efficiency can be obtained.

Referring to FIG. 4, during heat transfer, the heat generated by the electronic devices such as the central processing unit 4 is absorbed by the central portion of the heat pipe, such that phase transition of the work fluid in the first perforation region 21 occurs, and the work fluid is spread all over the upper lid 10 attached to the heat sink 3. Therefore, the heat will be easily absorbed or dissipated by the heat sink 3, such that the work fluid is cooled down and condensed back to liquid phase and flows through the ribs 24 via the channels 25 towards the second perforation regions 22 or back to the first perforation region 21. Thereby, heat is circulated within the heat pipe to obtain the heat transfer and dissipation functions.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A supporting structure for a planar heat pipe, comprising:

a housing, including an upper lid and a lower lid engaged with each other to form a hollow chamber allowing a work fluid to be introduced therein; and a support member, including a planar member perforated with a plurality of perforation regions, the support member being sintered with the upper and the lower lids in the hollow chamber by power metallurgy;

wherein perforation regions being in fluid communication with each other further comprising a first perforation region located at a center of the planar member, a plurality of second perforation regions extending around the first perforation region, and a plurality of third perforation regions extending between the second perforation region and a periphery of the planar member.

2. The structure according to claim 1, wherein the second perforation regions extend as a cross to define four diagonal areas for forming the third perforation regions, and the planar member further comprises a plurality of ribs to isolate the first, second and third perforation regions from each other, each of the ribs comprises a channel recessed from a top surface of the rib to provide the fluid communication.

* * * * *